(12) United States Patent
Yaguchi et al.

(10) Patent No.: US 6,512,176 B2
(45) Date of Patent: Jan. 28, 2003

(54) SEMICONDUCTOR DEVICE

(75) Inventors: Akihiro Yaguchi, Iwama (JP); Ryo Haruta, Kodaira (JP); Masahiro Ichitani, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/046,230

(22) Filed: Jan. 16, 2002

(65) Prior Publication Data
US 2002/0056561 A1 May 16, 2002

Related U.S. Application Data

(63) Continuation of application No. 09/525,026, filed on Mar. 14, 2000, now Pat. No. 6,340,793.

(30) Foreign Application Priority Data

Mar. 17, 1999 (JP) ............................................. 11-71409

(51) Int. Cl.[7] .............................................. H01L 23/28
(52) U.S. Cl. ...................... 174/52.4; 174/52.2; 257/668; 257/678; 257/787
(58) Field of Search .............................. 174/52.2, 52.3, 174/52.4, 255, 258, 259, 260; 257/678, 668, 676, 778, 787

(56) References Cited

U.S. PATENT DOCUMENTS

| | | | |
|---|---|---|---|
| 5,204,540 A | 4/1993 | Nakashima et al. ........ 257/480 |
| 5,767,446 A | 6/1998 | Ha et al. .................... 174/52.4 |
| 5,874,784 A | 2/1999 | Aoki et al. | |
| 5,953,592 A | * 9/1999 | Taniguchi et al. .......... 438/118 |
| 6,020,218 A | 2/2000 | Shim et al. | |
| 6,025,650 A | * 2/2000 | Tsuji et al. .................. 257/668 |
| 6,080,932 A | 6/2000 | Smith et al. ................ 174/52.4 |
| 6,200,121 B1 | * 3/2001 | Tsuruta ........................ 257/724 |
| 6,331,451 B1 | * 12/2001 | Fusaro et al. ................ 257/702 |
| 6,340,793 B1 | * 1/2002 | Yaguchi et al. ............. 174/260 |

FOREIGN PATENT DOCUMENTS

| JP | 00-83210 | 6/1910 |
|---|---|---|
| JP | 9-293471 | 4/1996 |

* cited by examiner

*Primary Examiner*—Dean A. Reichard
*Assistant Examiner*—Carmelo Oliva
(74) *Attorney, Agent, or Firm*—Antonelli, Terry, Stout & Kraus, LLP

(57) ABSTRACT

In a ball grid array type semiconductor device mounted on a printed wiring board, the external terminals can be prevented from being broken down even when the ambient temperature on the device is repeatedly changed. A flexible adhesive member for gluing the semiconductor chip to an insulating tape is provided to cover up to a region including the lands to which the external terminals are bonded and which are provided on the insulating tape surface. The flexible adhesive member for covering the lands may be replaced by a flexible low-elasticity member.

18 Claims, 5 Drawing Sheets

SEMICONDUCTOR DEVICE

This is a continuation of parent application Ser. No. 09/525,026, filed Mar. 14, 2000 now U.S. Pat. No. 6,340,793, the entire disclosure of which is hereby incorporated by reference.

BACKGROUND OF THE INVENTION

The present invention relates to a semiconductor device formed of an insulating tape that has an electrically conductive wiring provided to electrically connect a semiconductor chip and external terminals, and particularly to a ball grid array (BGA) type semiconductor device with its external terminals made of spherical solder balls.

A BGA type semiconductor device suitable for multiple pins, small size and high-speed operation has been practically used in order to increase the mounting density of semiconductor devices. The BGA type semiconductor device has solder bumps disposed as its external terminals in a two-dimensional array on the surface of the semiconductor device. In the BGA type semiconductor device, a member called an interposer is also used that has a conductive wiring formed on and/or within its surface in order to electrically connect the semiconductor chip and the external terminals. The interposer is used in a form of a printed wiring board of which the base material is a glass/epoxy resin, or in another form of an insulating tape having a conductive wiring on the surface of a base made of polyimide or the like.

A semiconductor device using the insulating tape with conductive wiring formed is described in "High Connection Reliability Cleared by Structure-Improved CSP", Nikkei Microdevice, February, 1998, pp. 48–55. In a conventional BGA semiconductor device as illustrated in FIG. 10, an insulating tape 2 as an interposer is used that has a conductive wiring 4, bonding pads 3, lands 5 and an insulating film 6. A semiconductor chip 1 has its lower side 1b mounted on a semiconductor chip mounting surface 2a of the insulating tape 2 with an adhesive member 8. The bonding pads 3 formed on the semiconductor chip mounting surface 2a of the insulating tape 2 are respectively located within openings 12 that are formed in the insulating film 6. The bonding pads and electrodes formed on the upper surface, 1a of the semiconductor chip 1, though not shown are electrically connected by bonding metal fine wires 7 to those pads and electrodes, respectively. A sealing member, or mold 9 is provided on the chip mounting surface 2a side of the insulating tape 2, sealing the semiconductor chip 1 and the metal fine wires 7. The external terminals, 10 are provided on the mounted side 2b of the insulating tape 2, and bonded to the lands 5 within openings 11 of tape 2. The semiconductor chip 1 and external terminals 10 are electrically connected through the metal fine wires 7, bonding pads 3, conductive wiring 4 and lands 5.

SUMMARY OF THE INVENTION

In the conventional semiconductor device shown in FIG. 10, the semiconductor chip 1 is made of a material of silicon (Si) of which the linear expansion coefficient is about $2\sim 3\times 10^{-6}/°$ C. The insulating tape 2 is made of a base material such as polyimide resin or glass/epoxy resin of which the linear expansion coefficient is about $10\times 10^{-6}/°$ C. The sealing mold 9 is chiefly epoxy resin with silica particles filled, and has a linear expansion coefficient of about $8\sim 14\times 10^{-6}/°$ C.

The semiconductor device is usually mounted through the external terminals 10 on a printed wiring board or substrate that is made of a base material of a glass/epoxy resin (for example, FR-4) of which the linear expansion coefficient is about $15\sim 16\times 10^{-6}/°$ C. The linear expansion coefficient of the whole conventional semiconductor device is close to that of the semiconductor chip 1 because the proportion of the semiconductor chip 1 within the whole semiconductor device is large.

When the semiconductor device mounted on the printed wiring board undergoes a temperature cycle test for reliability, or experiences a temperature change, a distortion is caused at the external terminals 10 made of chiefly a solder material (such as Pb—Sn based eutectic solder or Sn—Ag—Cu based solder) due to the linear expansion coefficient difference between the semiconductor device and the printed wiring board.

In the conventional semiconductor device shown in FIG. 10, only one side, or the chip mounting side 2a, of the insulating tape 2 is sealed with the sealing mold 9. Therefore, when the temperature is decreased, the semiconductor device is deformed to curve, causing a distortion at the external terminals 10 due to the contraction of the sealing mold 9. The distortion due to the warp is super-imposed on the distortion that is caused by the linear expansion coefficient difference of the semiconductor device to the printed wiring board, thus further increasing the distortion at the external terminals. When the external terminals 10 are greatly distorted and subjected to repetitive temperature changes, they are cracked and finally broken down.

The distortion due to the above factors becomes the largest at the external terminal 10a that is bonded to the land 5a close to the edge of the semiconductor chip 1 of which the linear expansion coefficient is the smallest in the semiconductor device. The breakdown will be most probably caused from this portion. Particularly when the land 5a close to the edge of the semiconductor chip 1 is disposed to extend across the side edge of the semiconductor chip 1 as shown in FIG. 10, a large distortion is caused thereat as will be apparent from the following reason. Although the distortion at such a part of the external terminal 10a as located right under the semiconductor chip 1 can be alleviated by the deformation of the adhesive member 8 that is elastic, the other portion over which there is no semiconductor chip 1 is restricted by the sealing agent 9 and thus cannot be freely deformed. Therefore, a large distortion is concentrated at the end of the external terminal 10a that is located outside the side edge of the semiconductor chip 1, causing it to break down with a high probability.

When the linear expansion coefficient of the sealing agent 9 is not so large, the external terminal 10b located at the edge of the semiconductor device is sometimes distorted greatly, thus broken down with some probability as is similar to the external terminal 10a close to the edge of the semiconductor chip 1.

Occurrence of breakdown of the external terminal 10 will result in electrical disconnection, and therefore the semiconductor device does not properly operate, thus the reliability of the semiconductor device being remarkably reduced.

Accordingly, it is an object of the invention to provide a semiconductor device of particularly BGA type capable of preventing/suppressing the external terminals from being broken down, or having high reliability.

The above object can be achieved by the semiconductor device having, for example, such structures of (A)~(H) as described below.

(A) A structure having a first insulating member, external terminals provided on a main surface of the first insulating member, a semiconductor chip provided on the opposite side to the side of the first insulating member on which the external terminals are provided, a conductive member for electrically connecting the semiconductor chip and the external terminals, and a sealing member provided on the opposite side to the side of the first insulating member on which the external terminals are provided, wherein a second insulating member is interposed between the semiconductor chip and the first insulating member, and the outer edge of the second insulating member extends from the outer edge of the semiconductor chip.

(B) A structure having a first insulating member, external terminals provided on a main surface of the first insulating member, a semiconductor chip provided on the opposite side to the side of the first insulating member on which the external terminals are provided, a conductive member for electrically connecting the semiconductor chip and the external terminals, and a sealing member provided on the opposite side to the side of the first insulating member on which the external terminals are provided, wherein a second insulating member is interposed between the semiconductor chip and the first insulating member, and the outer edge of the second insulating member extends to a location corresponding to the outer edge of the external terminal that is located outside the outer edge of the semiconductor chip and nearest to the semiconductor chip side.

(C) A structure having an insulating tape including a plurality of bonding pads and lands and a conductive wiring for electrically connecting the bonding pads and the lands, a semiconductor chip, a conductive member for electrically connecting the semiconductor chip and the bonding pads, an adhesive member that is adhesive to the semiconductor chip and provided on the semiconductor chip mounting side of the insulating tape except at least the bonded area of the bonding pads with the conductive member, a sealing member for sealing the surroundings of the semiconductor chip and the conductive member, and external terminals bonded to the lands.

The adhesive member is originally used for mounting the semiconductor chip on the surface of the insulating tape, and therefore usually provided only on the underside of the semiconductor chip. The adhesive member is made of epoxy based resin or polyimide based resin, and these materials are usually more flexible than the insulating tape material. This adhesive member is provided not only on the underside of the semiconductor chip but also on the semiconductor chip mounting side of the insulating tape except the bonding pad region, so that the distortion caused at the external terminals due to the linear expansion coefficient difference between the semiconductor chip and the printed wiring board or substrate can be alleviated by the deformation of the flexible adhesive member. In addition, since the amount of warp of the semiconductor device due to the contraction of the sealing member can be decreased, the distortion caused at the external terminals due to the warp can be reduced.

Moreover, in order to make full use of the flexible property of the adhesive member, it is desirable to make the elastic coefficient of the adhesive member smaller than that of the insulating tape. When the elastic coefficient of the adhesive member is small, the adhesive member itself can be easily deformed to absorb the deformation caused at the external terminals. Thus, the distortion at the external terminals can be reduced more. The elastic coefficient (longitudinal modulus of elasticity) of the insulating tape is about 3000~9000 MPa. The elastic coefficient of the material of the adhesive member is smaller than that, but it is actually about 1000 MPa.

(D) A structure having an insulating tape including a plurality of bonding pads and lands and a conductive wiring for electrically connecting the bonding pads and the lands, a semiconductor chip, a conductive member for electrically connecting the semiconductor chip and the bonding pads, an adhesive member for gluing the semiconductor chip to the semiconductor chip mounting side of the insulating tape, a sealing member for sealing the surroundings of the semiconductor chip and the conductive member, and external terminals bonded to the lands that are located on both the outside and inside of the edge of the semiconductor chip, wherein the adhesive member is provided to cover a region including at least the lands located outside the edge of the semiconductor chip.

When the lands bonded to the external terminals are provided outside and inside the edge of the semiconductor chip, the adhesive member, which itself is used for mounting the semiconductor chip on the insulating tape surface, is usually provided to cover only the lands located inside the edge of the semiconductor chip, or on the underside of the chip.

Since the adhesive member that is more flexible than the insulating tape is provided not only to cover the lands located on the underside of the semiconductor chip but also the lands located on the outside of the edge of the semiconductor chip, the distortion caused at the external terminals due to the linear expansion coefficient difference between the semiconductor device and the printed wiring board can be alleviated by the deformation of the flexible adhesive member. In addition, since the amount of warp of the semiconductor device due to the contraction of the sealing member can be decreased, the distortion caused at the external terminals due to the warp can be reduced.

Moreover, in order to make full use of the flexible property of the adhesive member, it is desirable to make the elastic coefficient of the adhesive member smaller than that of the insulating tape.

(E) A structure having an insulating tape including a plurality of bonding pads and lands and a conductive wiring for electrically connecting the bonding pads and the lands, a semiconductor chip, a conductive member for electrically connecting the semiconductor chip and the bonding pads, an adhesive member for gluing the semiconductor chip to the semiconductor chip mounting side of the insulating tape, a sealing member for sealing the surroundings of the semiconductor chip and the conductive member, and external terminals bonded to the lands that are located on the outside of the edge of the semiconductor chip, wherein the adhesive member is provided to cover a region including at least the lands located outside the edge of the semiconductor chip.

When the lands bonded to the external terminals are provided outside the edge of the semiconductor chip, the adhesive member, which itself is used for mounting the semiconductor chip on the insulating tape surface, is usually provided only on the underside of the semiconductor chip but not to cover at least the lands located outside the edge of the semiconductor chip.

The adhesive member that is more flexible than the insulating tape material is provided to cover the region including the lands located outside the edge of the semiconductor chip, so that the distortion caused at the external terminals due to the linear expansion coefficient difference between the semiconductor device and the printed wiring board can be alleviated by the deformation of the flexible adhesive member. In addition, since the amount of warp of the semiconductor device due to the contraction of the sealing member can be decreased, the distortion caused at the external terminals due to the warp can be decreased.

Moreover, in order to make full use of the flexible property of the adhesive member, it is desirable to make the elastic coefficient of the adhesive member smaller than that of the insulating tape.

Also, it is desired that the adhesive member be made of a film-shaped material.

There is a method of mounting the semiconductor chip on the surface of the insulating tape, in which the adhesive member is previously provided on the semiconductor chip mounting area of the insulating tape and then the semiconductor chip is bonded through the adhesive member. In this case, the adhesive member is provided by applying a liquid material or a film-shaped material. In order to make effective use of the distortion reducing effect of the adhesive member, it is necessary that the adhesive member be made of a low-elasticity material, and assure a certain useful thickness. This is because the distortion caused at the external terminals due to the linear expansion coefficient difference between the semiconductor device and the printed wiring board is chiefly shearing strain.

The adhesive member according to the application of a liquid material is provided by means of screen printing or potting. However, these means are difficult in controlling the thickness of the adhesive member, and make the manufacturing process complicated.

The adhesive member according to the application of a film-shaped material provides an approximately uniform film thickness, and thus the thickness of the adhesive member after the bonding can be easily controlled. The semiconductor device can also be produced in the same way as in the prior art. The film-shaped adhesive member can be made equal to the thickness of the insulating tape, or to about 50~80 μm after the bonding of the semiconductor chip. Therefore, the adhesive member can be satisfactorily deformed to effectively reduce the distortion at the external terminals.

(F) A structure having an insulating tape having a plurality of bonding pads and lands and a conductive wiring for electrically connecting the bonding pads and the lands, a semiconductor chip, a conductive member for electrically connecting the semiconductor chip and the bonding pads, an adhesive member for gluing the semiconductor chip to the semiconductor chip mounting side of the insulating tape, a sealing member for sealing the surroundings of the semiconductor chip and the conductive member, and external terminals bonded to the lands, wherein the adhesive member is provided to cover a region including the lands that are located outside the edge of the semiconductor chip and at least close to the edge of the semiconductor chip.

When the conventional semiconductor device shown in FIG. 10 is mounted on a printed wiring board or substrate, the largest distortion is caused at the external terminal 10a close to the edge of the semiconductor chip that has the smallest linear expansion coefficient among the other parts of the semiconductor device. In other words, this external terminal 10a most probably breaks down.

Thus, the flexible adhesive member is provided to cover the region including the lands located close to and outside the edge of the semiconductor chip, so that the distortion caused at the external terminal bonded to this land can be alleviated by the deformation of the flexible adhesive member.

(G) A structure having an insulating tape having a plurality of bonding pads and lands and a conductive wiring for electrically connecting the bonding pads and the lands, a semiconductor chip, a conductive member for electrically connecting the semiconductor chip and the bonding pads, an adhesive member for gluing the semiconductor chip to the semiconductor chip mounting side of the insulating tape, a sealing member for sealing the surroundings of the semiconductor chip and the conductive member, and external terminals bonded to the lands that are located on both the outside and inside of the edge of the semiconductor chip, wherein a member with a lower elastic coefficient than the insulating tape is provided on the semiconductor chip mounting side of the insulating tape and to cover the lands located outside the projected plane of the semiconductor chip.

(H) A ball grid array type structure having an insulating tape having a plurality of bonding pads and lands and a conductive wiring for electrically connecting the bonding pads and the lands, a semiconductor chip, a conductive member for electrically connecting the semiconductor chip and the bonding pads, an adhesive member for gluing the semiconductor chip to the semiconductor chip mounting side of the insulating tape, a sealing member for sealing the surroundings of the semiconductor chip and the conductive member, and external terminals bonded to the lands located outside the edge of the semiconductor chip, wherein a member with a lower elastic coefficient than the insulating tape is provided on the semiconductor chip mounting side of the insulating tape and to cover the lands located outside the projected plane of the semiconductor chip.

Since the flexible low-elasticity member is provided to cover the lands that are located outside the projected plane of the semiconductor chip, the distortion caused at the external terminals due to the linear expansion coefficient difference between the semiconductor device and the printed wiring board can be alleviated by the deformation of the flexible low-elasticity member. In addition, since the amount of warp of the semiconductor chip due to the contraction of the sealing member can be decreased, the distortion caused at the external terminals due to the warp can be reduced.

Since the lands located inside the projected plane of the semiconductor chip are covered by the flexible adhesive member, the distortion caused at the external terminals bonded to the lands inside the edge can be reduced by the distortion alleviating action of the deformed adhesive member.

Furthermore, in order to make full use of the flexible property of the adhesive member and low-elasticity member, it is desired that the elastic coefficients of both materials be smaller than that of the insulating tape. When the adhesive member and low-elasticity member have small elastic coefficients, these members themselves can be easily deformed. Thus, since the deformations of the external terminals can be easily absorbed by the deformations of the adhesive member and low-elasticity member, the distortion caused at the external terminals can be further reduced.

The inventors of the present invention application examined by finite element method how the solder material of which the external terminals are made is distorted when the semiconductor device of the following structure is mounted on a printed circuit board or substrate, and when the ambient temperature is changed from 125° C. to −55° C. The result was that when the adhesive member was provided inside the projected plane of the semiconductor chip, or beneath the chip, the external terminals close to the edge of the semiconductor chip were distorted 1.5%, while when the adhesive member was provided on both the outside and inside of the projected plane of the semiconductor chip, these external terminals were distorted as low as 1.1%. The specifications of the semiconductor chip used for the analysis are given below.

Size of semiconductor device: 13 mm×13 mm
Size of semiconductor chip: 8.8 mm×8.8 mm
Number of external terminals: 176
Distance between external terminals: 0.8 mm

DESCRIPTION OF THE EMBODIMENTS

Embodiments of the invention will be described with reference to the accompanying drawings.

Figure 1:
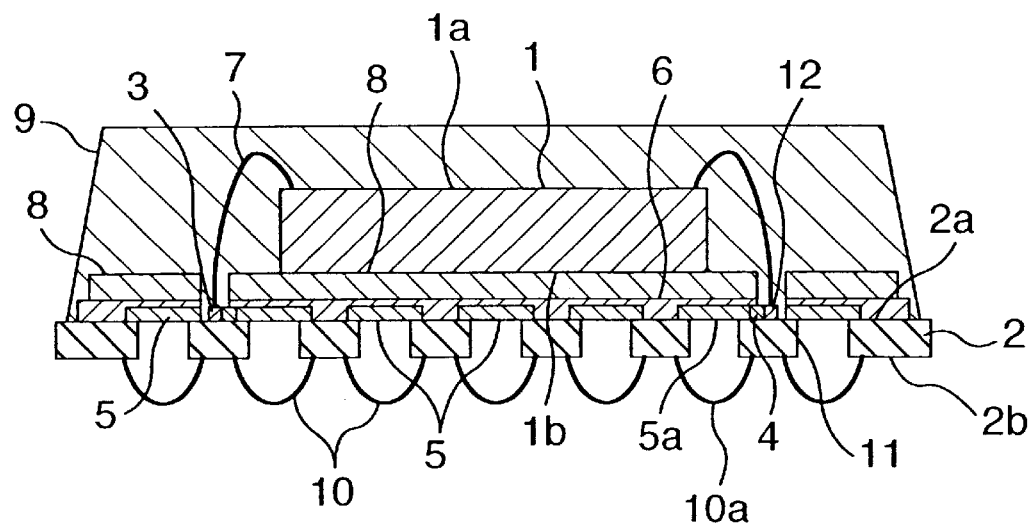
FIG. 1 is a cross-sectional view of a semiconductor device of a first embodiment according to the invention.
Figure 2:
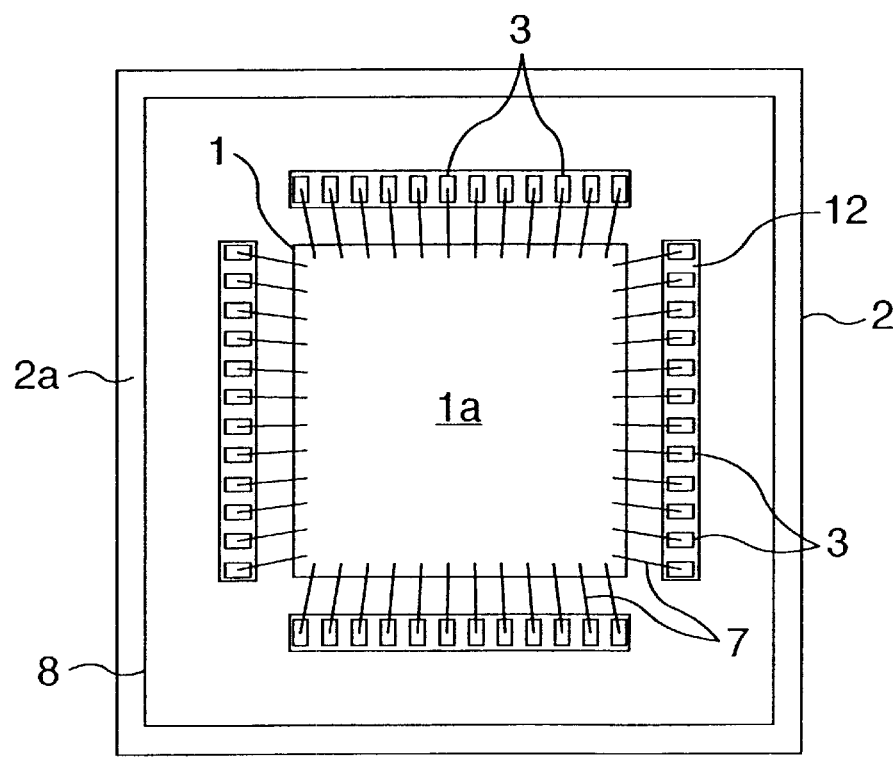
FIG. 2 is a plan view of the semiconductor device of the first embodiment according to the invention with the sealing agent removed.

FIG. 1 is a cross-sectional view of a semiconductor device of the first embodiment according to the invention, and FIG. 2 is a plan view thereof with the sealing agent removed.

Referring to FIGS. 1 and 2, a semiconductor device of this embodiment has the semiconductor chip 1, the bonding pads 3, the insulating tape 2 formed of the conductive wiring 4 and lands 5, the adhesive member 8, the metal fine wires 7 for electrically connecting the semiconductor chip 1 and the bonding pads 3, the sealing mold 9 for covering the semiconductor chip 1 and metal fine wires 7, and the external terminals 10.

On the semiconductor chip mounting side 2a of the insulating tape 2, there are provided the bonding pads 3 to which the metal fine wires 7 are bonded, the lands 5 to which the external terminals 10 are bonded, and the conductive wiring 4 for electrically connecting the bonding pads and the lands 5. The conductive wiring 4 and lands 5 are covered by the insulating film 6. The semiconductor chip 1 has its lower side 1b bonded to the semiconductor chip mounting side 2a of the insulating tape 2 with the adhesive member 8. The adhesive member 8 is provided not only on the bottom area of the semiconductor chip 1 but also on an area out of the side edge of the chip 1 in order to cover through the insulating film 6 the lands 5 that are provided inside and outside the plane of the semiconductor chip 1. The bonding pads 3 are respectively formed within the openings 12 that are bored in the insulating film 6 and adhesive member 8.

One end of each metal fine wire 7 is bonded to the bonding pad 3 within the opening 12. The other end of the metal fine wire 7 is bonded to an electrode that is formed on the top 1a of the semiconductor chip 1, though not shown. On the board side 2b of the insulating tape 2, there are formed tape holes 11 that reach the lands 5. The external terminals 10 are bonded to the lands 5 through the holes, respectively.

The conductive wiring 4 is made of copper (Cu) foil or copper foil plated on its surface with gold (Au), nickel (Ni) or the like. The bonding pads 3 and lands 5 provided along the conductive wiring 4 are made of the same material as above, and the surfaces thereof are sometimes plated in accordance with their locations.

The external terminals 10 are made of a solder material (for example, Pb—Sn based eutectic solder or Sn—Ag—cu based solder). Solder balls or solder paste of that material are respectively placed in the holes 11, and then fused to bond to the lands 5.

The adhesive member 8 is made of a single material of mono-layer structure or an adhesive material coated on a tape-like substrate surface in a three or more layer structure. The mono-layer structure material may be epoxy based resin, polyimide based resin, epoxy+polyimide based resin, resin composed of epoxy resin and acrylic rubber, acrylic resin, porous polytetrafluoroethylene resin or silicone based resin. The mono-layer structure adhesive member 8 may be formed on the surface of the insulating tape 2 by screen printing or potting or formed in a film shape and attached thereto. It may also be formed on the underside 1b of the semiconductor chip 1. The adhesive member 8 of a three-layer structure is formed of layers of the above-given mono-layer structure material coated on the surface of a tape-like substrate made of polyimide resin.

The metal fine wires 7 are made of a material of gold (Au), silver (Ag) or aluminum (Al). The insulating film 6 is called solder resist, which is made of epoxy resin, polyimide resin or polybutadiene resin.

The sealing mold 9 is made of a sealing material of epoxy resin as thermosetting resin, with silica particles filled. This material is thermally set to form the sealing mold by transfer molding or potting.

In the semiconductor device of this embodiment, as described above, the flexible adhesive member 8 is formed to cover not only the lands 5 located inside the plane of the semiconductor chip 1 but also part or all lands 5 outside the plane thereof. Therefore, after the semiconductor device is mounted through the external terminals 10 on a printed wiring board, the distortion caused at the external terminals 10 due to the linear expansion coefficient difference between the semiconductor device and the printed wiring board can be alleviated by the deformation of the flexible adhesive member 8. In addition, since the amount of the warp of the semiconductor device that is caused by the contraction of the sealing mold 9 can be reduced, it is possible to reduce the distortion caused at the external terminals 10 by this warp.

Therefore, the external terminals 10 can be prevented from being broken down after the semiconductor device is mounted on a printed wiring board, making the semiconductor device highly reliable.

Moreover, in order to make full use of the flexible property of the adhesive member 8 it is desirable to make the elastic coefficient of the adhesive member 8 smaller than that of the insulating tape 2. The reduction of the elastic coefficient of the adhesive member 8 will make the adhesive member 8 itself more easily deform so that the deformation of the external terminals 10 can be easily absorbed by the deformation of the adhesive member 8. Thus, the distortion caused at the external terminals 10 can be further reduced.

The first embodiment shown in FIGS. 1 and 2 has the insulating film 6 provided on the chip mounting side 2a of the insulating tape 2. The insulating film 6 can protect the conductive wiring 4 and the lands 5 from the outside, and prevent the semiconductor chip 1 from being made in direct contact with those wiring and lands, causing short circuits. When the adhesive member 8 is provided to cover the lands 5 and conductive wiring 4 as in this embodiment, the adhesive member 8 itself has an insulating property, and hence the semiconductor device can be protected without the insulating film 6.

Moreover, in the first embodiment shown in FIGS. 1 and 2, the adhesive member 8 covers all the lands formed on the surface of the insulating tape 2. When the semiconductor device is mounted on a printed wiring board, the maximum distortion occurs at the external terminal 10a that is bonded to the land 5a close to the edge of the semiconductor chip 1 of which the linear expansion coefficient is the smallest as compared with those of the other members of the device. In other words, this external terminal 10a is the easiest to break down.

Figure 3:
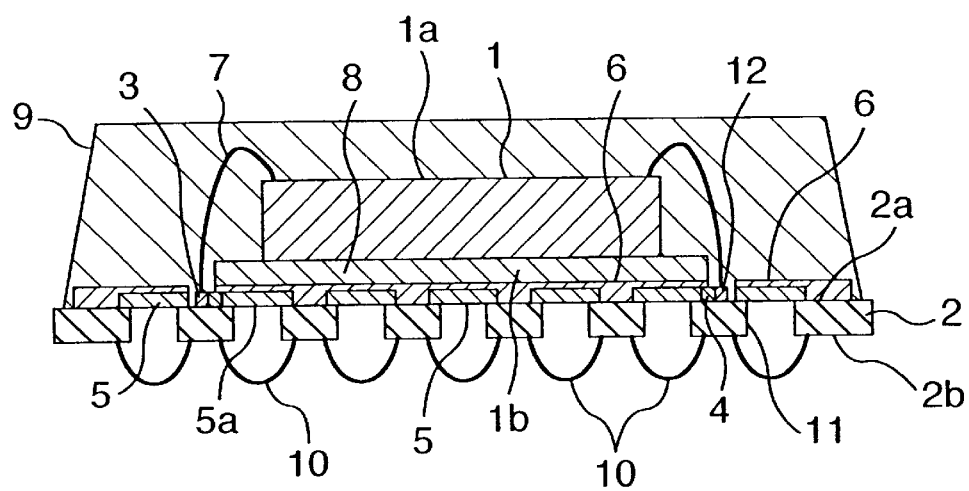
FIG. 3 is a cross-sectional view of a modification of the first embodiment according to the invention.

Therefore, as shown in FIG. 3, the flexible adhesive member 8 is formed to cover the region including the land 5a that is provided close to the edge of the semiconductor chip 1 and located at least partially outside that edge. The deformation of this flexible adhesive member 8 can alleviate the distortion caused at the external terminal 10a bonded to the land 5a.

Figure 4:
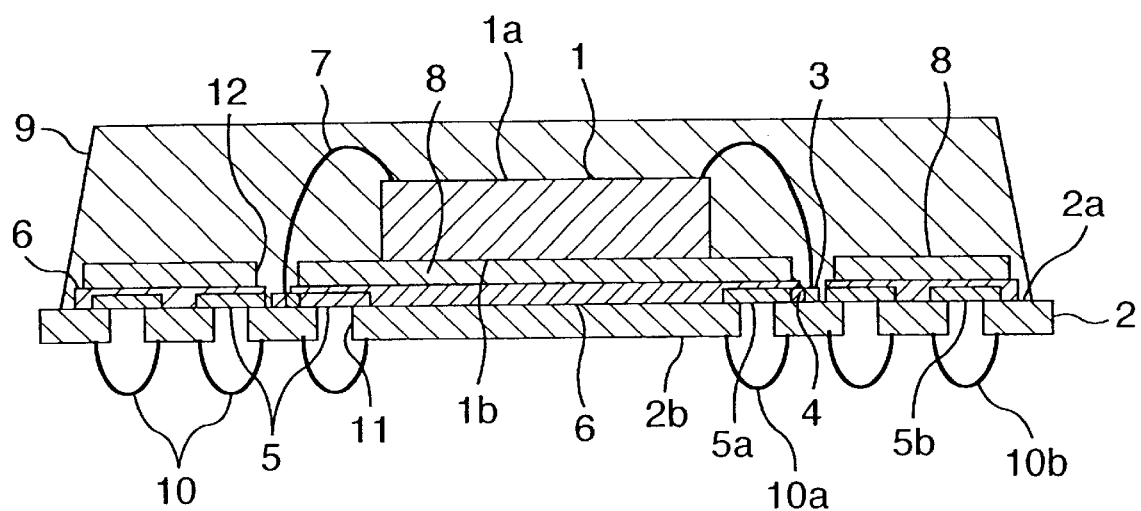
FIG. 4 is a cross-sectional view of a semiconductor device of a second embodiment according to the invention.

FIG. 4 is a cross-sectional view of a semiconductor device of the second embodiment according to the invention.

The construction of the semiconductor device of this embodiment is fundamentally the same as that of the first embodiment, but different in that the lands 5 are provided outside the edge of the semiconductor chip 1, and that the flexible adhesive member 8 is provided to cover up to the region including the land 5b that is located outside the edge of the semiconductor chip 1 and at the edge of the semiconductor device.

The semiconductor device with the lands 5 provided outside the edge of the chip 1 as shown in FIG. 4 has a large size as compared with the semiconductor device with the lands 5 provided inside the edge (the plane) of the chip 1. Therefore, after the semiconductor device is mounted on a printed wiring board, the distortion of the external terminal 10b provided at the edge of the device sometimes increases together with that of the external terminal 10a close to the chip 1. This is caused when the sealing mold 9 is made of a material of small linear expansion coefficient. In this embodiment, since the adhesive member 8 is provided to cover up to the region including the land 5b bonded to the external terminal 10b that is located at the edge of the semiconductor device, the distortions of both the external terminal 10a close to the chip 1 and the external terminal 10b at the edge of the device can be reduced.

According to this embodiment, after the semiconductor device is mounted on a printed wiring board through the external terminals 10, the distortions occurring at the external terminals 10 due to the linear expansion coefficient difference between the semiconductor device and the printed wiring board can be alleviated by the deformation of the flexible adhesive member 8. In addition, since the amount of warp of the semiconductor device due to the contraction of the sealing mold 9 can be reduced, the distortion of the external terminals 10 due to this warp can be reduced.

Therefore, the external terminals 10 can be prevented from being broken down after the semiconductor device is mounted on a printed wiring board, making the semiconductor device highly reliable.

Moreover, in order to make full use of the flexible property of the adhesive member 8 it is desirable to make the elastic coefficient of the adhesive member 8 smaller than that of the insulating tape 2. The reduction of the elastic coefficient of the adhesive member 8 will make the adhesive member 8 itself more easily deform so that the deformation of the external terminals 10 can be easily absorbed by the deformation of the adhesive member 8. Thus, the distortion caused at the external terminals 10 can be further reduced.

Also, in the second embodiment shown in FIG. 4, all the lands 5 formed on the surface of the insulating tape 2 are covered by the adhesive member 8. When the semiconductor device is mounted on a printed wiring board, the largest distortion is caused at the external terminal 10a close to the edge of the semiconductor chip of which the linear expansion coefficient is the smallest as compared with those of the other members of the device. That is, this external terminal 10a is the easiest to break down.

Figure 5:
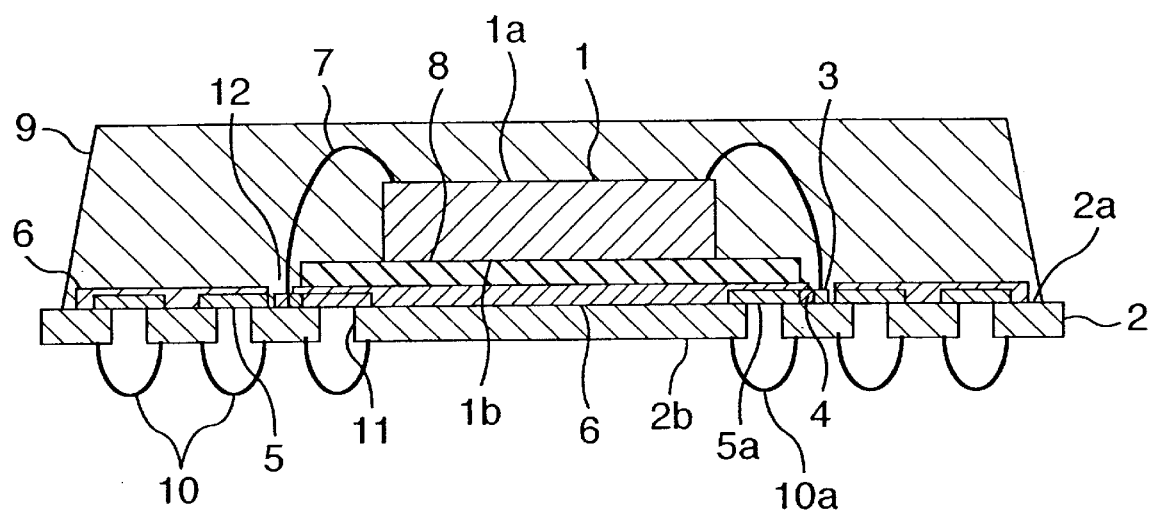
FIG. 5 is a cross-sectional view of a modification of the second embodiment according to the invention.

Thus, as shown in FIG. 5, the flexible adhesive member 8 is formed to cover up to the region including at least the land 5a that is located close to the edge of the semiconductor chip 1, so that the distortion at the external terminal 10a bonded to the land 5a can be alleviated by the deformation of the flexible adhesive member 8.

Figure 6:
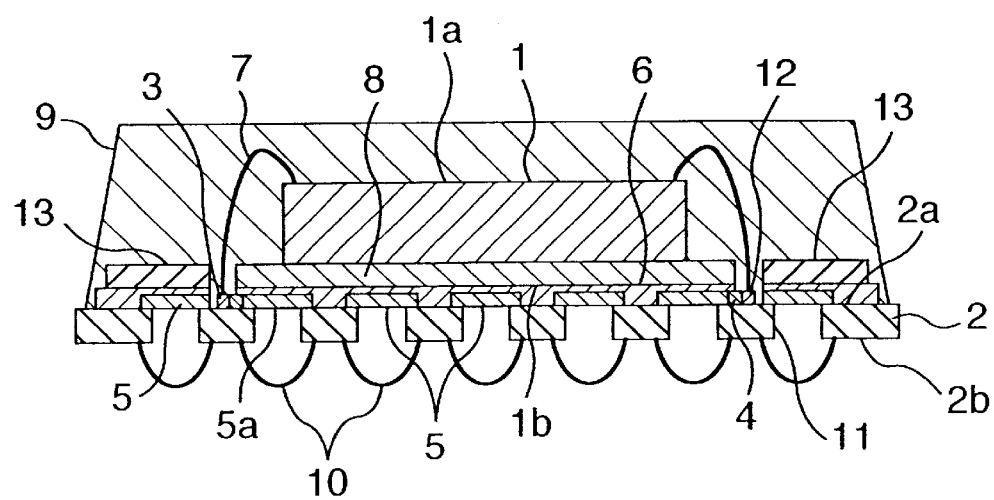
FIG. 6 is a cross-sectional view of a semiconductor device of a third embodiment according to the invention.
Figure 7:
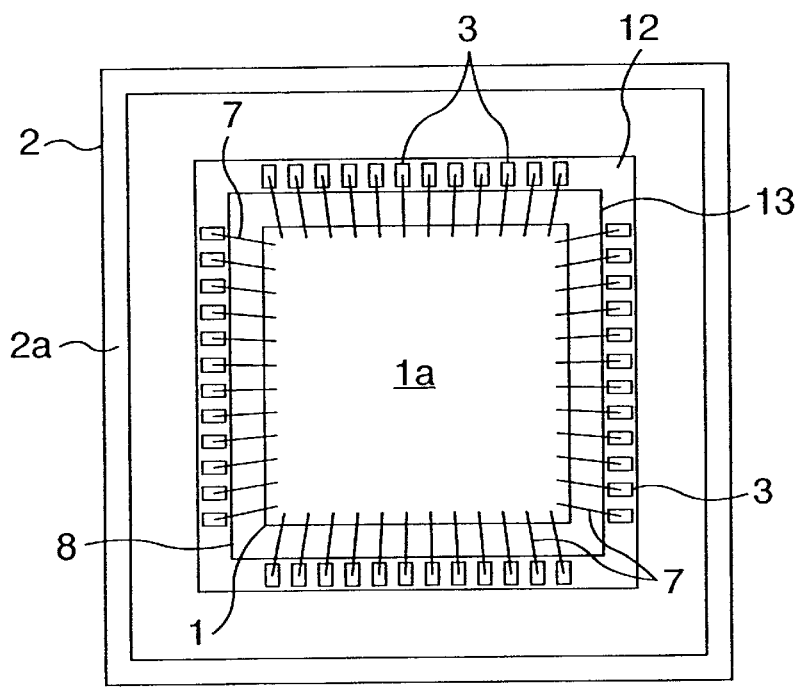
FIG. 7 is a plan view of the semiconductor device of the third embodiment according to the invention with the sealing agent removed.

FIG. 6 is a cross-sectional view of a semiconductor device of the third embodiment according to the invention. FIG. 7 is a plan view of the semiconductor device of FIG. 6 with its sealing mold removed.

The construction of the semiconductor device of this embodiment is fundamentally the same as that of the first embodiment, but different from the first embodiment in that the lands 5 located on the central side relative to the bonding pads 3 are covered through the insulating film 6 by the adhesive member 8 and that the lands 5 located on the outside of the bonding pads 3 are covered through the insulating film 6 by a low-elasticity member 13.

The low-elasticity member 13 is made of a material having the same flexibility as the adhesive member. For example, it is a single material of mono-layer structure or an adhesive material of three or more layer structure coated on a tape-like substrate. The mono-layer structure material may be epoxy based resin, polyimide based resin, epoxy+ polyimide based resin, resin formed of epoxy resin and acrylic rubber, acrylic based resin, porous polytetrafluoroethylene resin or silicone based resin. The mono-layer structure low-elasticity member 13 may be formed on the surface of the insulating tape 2 by screen printing or potting or formed in a film shape and attached thereto. It may also be formed on the underside 1b of the semiconductor chip 1. The low-elasticity member 13 of a three-layer structure is formed of layers of the above-given mono-layer structure material coated as an adhesive on the surface of a tape-like substrate made of polyimide resin.

According to this embodiment, since the lands 5 are covered by the flexible adhesive member 8 or low-elasticity member 13, the distortion caused at the external terminals 10 due to the linear expansion coefficient difference between the semiconductor device and the printed wiring substrate can be alleviated by the deformation of the flexible adhesive member 8 and low-elasticity member 13 after the semiconductor device is mounted through the external terminals 10 on a printed wiring board. In addition, since the amount of warp of the semiconductor device due to the contraction of the sealing mold 9 can be reduced, the distortion caused at the external terminals 10 due to this warp can be reduced.

Therefore, the external terminals 10 can be prevented from being broken down after the semiconductor device is mounted on a printed wiring board, thus making the semiconductor device highly reliable.

Moreover, in order to make full use of the flexible property of the adhesive member 8 and low-elasticity member 13 it is desirable to make the elastic coefficients of these members smaller than that of the insulating tape 2. The reduction of the elastic coefficients of these members will make these members themselves more easily deform so that the deformation of the external terminals 10 can be easily absorbed by the deformation of these members. Thus, the distortion caused at the external terminals 10 can be further reduced.

Figure 8:
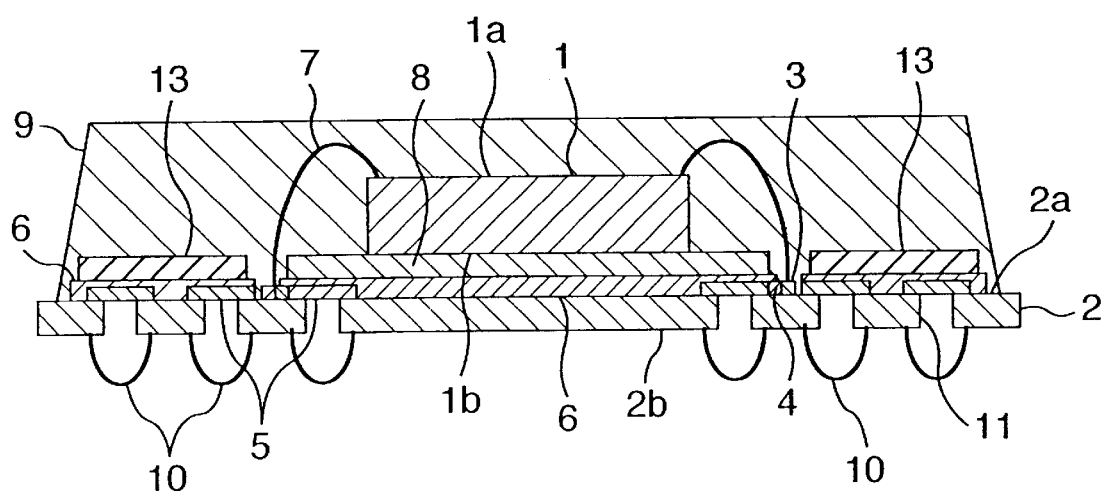
FIG. 8 is a cross-sectional view of a modification of the third embodiment according to the invention.

FIG. 8 is a cross-sectional view of a modification of the semiconductor device of FIG. 6.

In FIG. 8, the lands 5 are provided on the outside of the edge of the semiconductor chip 1. Of these lands 5, ones located on the center side relative to the bonding pads 3 are covered through the insulating film 6 by the adhesive member 8, and ones located on the outside of the bonding pads 3 are covered through the insulating film 6 by the low-elasticity member 13.

According to this embodiment, since the lands 5 located outside the edge of the semiconductor chip 1 are covered by the flexible adhesive member 8 or low-elasticity member 13, the distortions of the external terminals 10 due to the linear expansion coefficient difference between the semiconductor device and a printed wiring board can be alleviated by the deformation of the flexible adhesive member 8 and low-elasticity member 13 after the semiconductor device is mounted through the external terminals 10 on the printed wiring board. In addition, since the amount of warp of the semiconductor device due to the contraction of the sealing mold 9 can be reduced, the distortion of the external terminals 10 due to this warp can be reduced.

In this embodiment, the lands 5 located on the center side relative to the bonding pads 3 are covered through the insulating film 6 by the adhesive member 8. However, in the structure in which the lands 5 are located on the outside of the edge of the semiconductor chip 1 as in this embodiment, all the lands 5 may be covered by the low-elasticity member 13.

Figure 9:
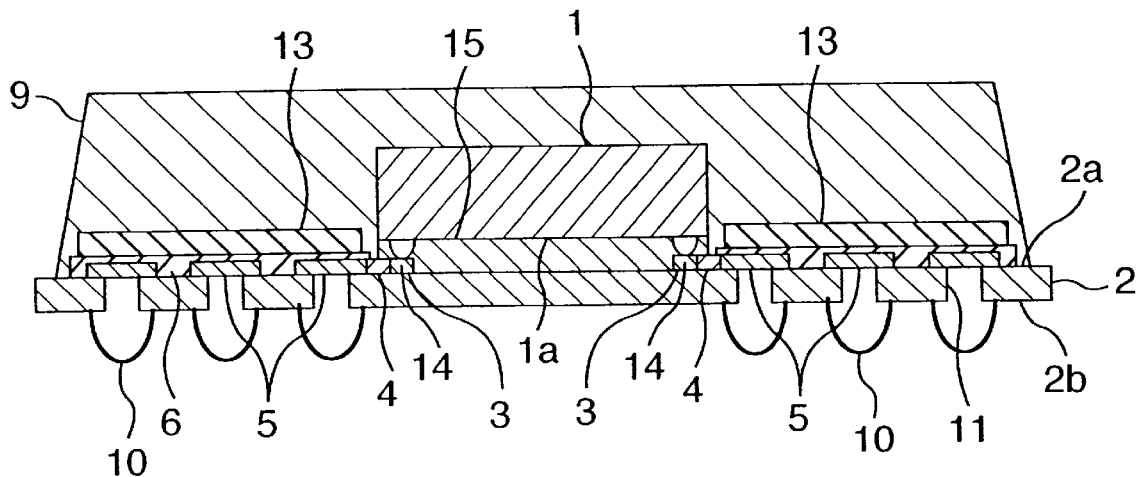
FIG. 9 is a cross-sectional view of a semiconductor device of a fourth embodiment according to the invention.
Figure 10:
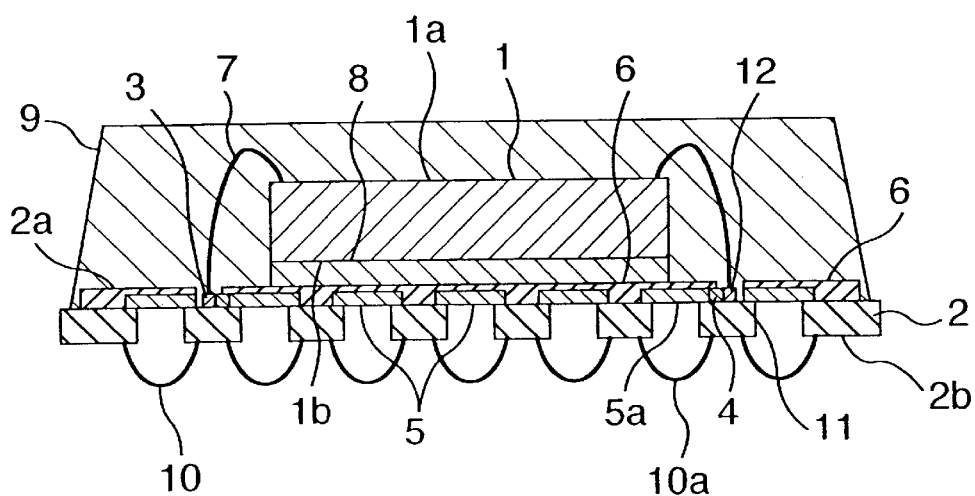
FIG. 10 is a cross-sectional view of an example of the conventional semiconductor device.

FIG. 9 is a cross-sectional view of a semiconductor device of the fourth embodiment according to the invention.

As shown in FIG. 9, the semiconductor device of this embodiment has the semiconductor chip 1, the bonding pads 3, the insulating tape 2 formed of the conductive wiring 4 and lands 5, a filler 15, bumps 14 for electrically connecting the semiconductor chip 1 and the bonding pads 3, the sealing mold 9 for covering the semiconductor chip 1, and the external terminals 10.

On the semiconductor chip mounting side 2a of the insulating tape 2, there are provided the bonding pads 3 to which the bumps 14 are bonded, the lands 5 to which the externals 10 are bonded, and the conductive wiring 4 for electrically connecting the bonding pads 3 and the lands 5. The lands 5 are located outside the edge of the semiconductor chip 1, and the lands 5 and part of the conductive wiring 4 are covered by the insulating film 6. The semiconductor chip 1 has its top 1a turned down to the chip mounting side 2a of the insulating tape 2, and mounted thereon. The electrodes, not shown, formed on the top 1a of the semiconductor chip 1 and the bonding pads 3 are electrically connected through the bumps 14. An adhesive member 15 is provided between the top 1a of the semiconductor chip 1 and the insulating tape 2 to protect the chip's top 1a, bumps 14 and junctions between the bumps 14 and the bonding pads 3. On the chip mounting side 2a of the insulating tape 2, there is also provided through the insulating film 6 the low-elasticity member 13 to cover the lands 5. The sealing mold 9 is provided on the chip mounting side 2a of the insulating tape 2 to cover the surroundings of the semiconductor chip 1. On the mounted side 2b of the insulating tape 2, there are provided tape openings 11 that reach the bottoms of the lands 5. The terminals 10 are connected through the openings 11 to the lands 5.

The conductive wiring 4 is made of copper (Cu) foil or copper foil plated with gold (Au), nickel (Ni) or other metal. The bonding pads 3 and lands 5 along the conductive wiring 4 are also made of the same material, and sometimes plated according to the locations in order to enhance the adhesion between the bumps 14 and the external terminals 10.

The external terminals 10 are made of a solder material (for example, Pb—Sn based eutectic solder or Sn—Ag—cu based solder). Solder balls or solder paste of that material are respectively placed in the holes 11, and then fused to bond to the lands 5.

The low-elasticity member 13 is made of a single material of mono-layer structure or an adhesive material coated on a tape-like substrate surface in a three or more layer structure. The mono-layer structure material may be epoxy based resin, polyimide based resin, epoxy+polyimide based resin, resin composed of epoxy resin and acrylic rubber, acrylic resin, porous polytetrafluoroethylene resin or silicone based resin. The mono-layer structure low-elasticity member 13 may be formed on the surface of the insulating tape 2 by screen printing or potting or formed in a film shape and attached thereto. It may also be formed on the underside 1b of the semiconductor chip 1. The low-elasticity member 13 of a three-layer structure is formed of layers of the above-given mono-layer structure material coated on the surface of a tape-like substrate made of polyimide resin. The adhesive member 15, which is called under film, is made of a flexible material chiefly of, for example, epoxy based resin, polyimide based resin or silicone based resin.

The bumps 14 are made of gold (Au), silver (Ag), Aluminum (Al) or solder (for example, Pb—Sn based eutectic solder). The insulating film 6, which is called solder resist, is made of epoxy resin, polyimide resin or polybutadiene resin.

The sealing mold 9 is made of a material of epoxy resin as a thermosetting resin, with silica particles filled. This material is thermally set by transfer molding or potting to form the sealing mold 9.

According to this embodiment, since the lands 5 located on the outside of the edge of the semiconductor chip 1 are covered by the flexible low-elasticity member 13, the distortion caused at the external terminals 10 due to the linear expansion coefficient difference between the semiconductor device and the printed wiring board can be alleviated by the deformation of the flexible low-elasticity member 13 after the semiconductor device is mounted through the external terminals 10 on the printed wiring board. In addition, since the amount of warp of the semiconductor device due to the contraction of the sealing mold 9 can be reduced, the distortion of the external terminals 10 due to this warp can also be reduced.

Moreover, according to the invention, the electrical paths can be shortened by bonding the semiconductor chip 1, the bonding pads 3 and bumps 14, making it possible to increase the operation speed of the semiconductor device.

According to the invention, since the distortion caused at the external terminals 10 due to the linear expansion coefficient difference between the semiconductor device and the printed wiring board, and to the warp of the semiconductor device can be reduced after the semiconductor device is mounted on a printed wiring board, the external terminals can be prevented from being broken down. Thus, a highly reliable semiconductor device can be provided.

What is claimed is:

1. A semiconductor device comprising:
    a first insulating member;
    external terminals provided on a main surface of said first insulating member;
    a semiconductor chip provided on an opposite side to said main surface of said first insulating member on which said external terminals are provided;
    a conductive member for electrically connecting said semiconductor chip and said external terminals, said conductive member being covered with an insulating portion comprised of said first insulating member; and
    a sealing member provided on the opposite side to said main surface of said first insulating member on which said external terminals are provided,
    wherein a second insulating member is interposed between said semiconductor chip and said first insulating member, wherein an outer edge of said second insulating member projects from an outer edge of said semiconductor chip, and wherein said sealing member covers said outer edge of said second insulating member.

2. A semiconductor device according to claim 1, wherein said second insulating member has a thickness from 50 μm to 80 μm.

3. A semiconductor device according to claim 1, wherein said second insulating member is a resin selected from a group consisting of epoxy resin, polyimide resin, resin containing epoxy resin and polyimide resin, resin composed of epoxy resin and acrylic based rubber, acrylic based resin, porous polytetrafluoroethylene resin, and silicon resin.

4. A semiconductor device according to claim 1, wherein said second insulating member is flexible and has a thickness substantially the same as that of said first insulating member.

5. A semiconductor device comprising:
    a first insulating member;
    external terminals provided on a main surface of said first insulating member;
    a semiconductor chip provided on an opposite side to said main surface of said first insulating member on which said external terminals are provided;
    a conductive member for electrically connecting said semiconductor chip and said external terminals, said conductive member being covered with an insulating portion comprised of said first insulating member; and
    a sealing member provided on the opposite side to said main surface of said first insulating member on which said external terminals are provided,
    wherein a second insulating member is interposed between said semiconductor chip and said first insulating member, wherein an outer edge of said second insulating member extends out to a location corresponding to an outer edge of said external terminal that is located outside an outer edge of said semiconductor chip and nearest to said semiconductor chip side, and wherein the sealing member covers said outer edge of the second insulating member.

6. A semiconductor device according to claim 5, wherein said second insulating member is flexible and has a thickness substantially the same as that of said first insulating member.

7. A semiconductor device comprising:
    an insulating tape having a plurality of bonding pads and lands and a conductive wiring for electrically connecting said bonding pads and said lands;
    a semiconductor chip;
    a conductive member for electrically connecting said semiconductor chip and said bonding pads, said conductive member being covered with an insulating portion comprised of said insulating tape;
    an adhesive member that is adhered to said semiconductor chip and provided on a semiconductor chip mounting side of said insulating tape except at least on a bonded area of said bonding pads with said conductive member;
    a sealing member for sealing surroundings of said semiconductor chip and said conductive member and covering an outer edge of said adhesive member; and
    external terminals bonded to said lands.

8. A semiconductor device according to claim 7, wherein said adhesive member has a thickness from 50 μm to 80 μm.

9. A semiconductor device according to claim 7, wherein in said insulating tape, said external terminals are positioned at an outer peripheral side of said bonding pads.

10. A semiconductor device according to claim 7, wherein said adhesive member is formed of low-elasticity material and has a thickness substantially the same as that of said insulating tape.

11. A semiconductor device comprising:
    an insulating tape having a plurality of bonding pads and lands and a conductive wiring for electrically connecting said bonding pads and said lands;
    a semiconductor chip;
    a conductive member for electrically connecting said semiconductor chip and said bonding pads, said conductive member being covered with an insulating portion comprised of said insulating tape;
    an adhesive member for gluing said semiconductor chip to a semiconductor chip mounting side of said insulating tape;
    a sealing member for sealing surroundings of said semiconductor chip and said conductive member and covering an outer edge of said adhesive member; and
    external terminals bonded to said lands that are located both outside and inside of an edge of said semiconductor chip,
    wherein said adhesive member is provided to cover a region including at least said lands located outside an edge of said semiconductor chip.

12. A semiconductor device according to claim 11, wherein said adhesive member is formed of low-elasticity material and has a thickness substantially the same as that of said insulating tape.

13. A semiconductor device comprising:
    an insulating tape having a plurality of bonding pads and lands and a conductive wiring for electrically connecting said bonding pads and said lands;
    a semiconductor chip;

a conductive member for electrically connecting said semiconductor chip and said bonding pads, said conductive member being covered with an insulating portion comprised of said insulating tape;

an adhesive member for gluing said semiconductor chip to a semiconductor chip mounting side of said insulating tape;

a sealing member for sealing surroundings of said semiconductor chip and said conductive member and covering an outer edge of said adhesive member; and external terminals bonded to said lands that are located outside of an edge of said semiconductor chip, wherein said adhesive member is provided to cover a region including at least said lands located outside the edge of said semiconductor chip.

14. A semiconductor device according to claim 13, wherein said adhesive member is formed of low-elasticity material and has a thickness substantially the same as that of said insulating tape.

15. A ball grid array semiconductor device comprising:

an insulating tape having a plurality of bonding pads and lands and a conductive wiring for electrically connecting said bonding pads and said lands;

a semiconductor chip;

a conductive member for electrically connecting said semiconductor chip and said insulating tape, said conductive member being covered with an insulating portion comprised of said insulating tape;

an adhesive member for gluing said semiconductor chip to a semiconductor chip mounting side of said insulating tape;

a sealing member for sealing surroundings of said semiconductor chip and said conductive member and covering an outer edge of said adhesive member; and external terminals bonded to said lands, wherein said adhesive member is provided to cover a region including said lands that are located outside an edge of said semiconductor chip.

16. A semiconductor device according to claim 15, wherein said adhesive member is formed of low-elasticity material and has a thickness substantially the same as that of said insulating tape.

17. A ball grid array semiconductor device comprising:

an insulating tape having a plurality of bonding pads and lands and a conductive wiring for electrically connecting said bonding pads and said lands;

a semiconductor chip;

a conductive member for electrically connecting said semiconductor chip and said bonding pads, said conductive member being covered with an insulating portion comprised of said insulating tape;

an adhesive member for gluing said semiconductor chip to a semiconductor chip mounting side of said insulating tape;

a sealing member for sealing surroundings of said semiconductor chip and said conductive member; and external terminals bonded to said lands that are located both outside and inside of an edge of said semiconductor chip, wherein a member is provided on a semiconductor chip mounting side of said insulating tape and which covers said lands located outside an edge of said semiconductor chip, and wherein the sealing member covers an outer edge of said adhesive member.

18. A semiconductor device according to claim 17, wherein said adhesive member is formed of low-elasticity material and has a thickness substantially the same as that of said insulating tape.

* * * * *